United States Patent
Langhammer et al.

(10) Patent No.: US 10,181,864 B2
(45) Date of Patent: Jan. 15, 2019

(54) METHODS AND APPARATUS FOR PERFORMING REED-SOLOMON ENCODING

(71) Applicant: Altera Corporation, San Jose, CA (US)

(72) Inventors: Martin Langhammer, Salisbury (GB); Sami Mumtaz, High Wycombe (GB); Simon Finn, High Wycombe (GB)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 15/054,395

(22) Filed: Feb. 26, 2016

(65) Prior Publication Data

US 2017/0250713 A1    Aug. 31, 2017

(51) Int. Cl.
*H03M 13/15* (2006.01)
*H03M 13/00* (2006.01)
*H03M 13/21* (2006.01)

(52) U.S. Cl.
CPC ..... *H03M 13/1515* (2013.01); *H03M 13/159* (2013.01); *H03M 13/616* (2013.01); *H03M 13/617* (2013.01)

(58) Field of Classification Search
CPC ........... H03M 13/1515; H03M 13/616; H03M 13/617; H03M 13/152; H03M 13/1545; H03M 13/159
See application file for complete search history.

(56) References Cited

U.S. PATENT DOCUMENTS

| | | | |
|---|---|---|---|
| 4,835,775 A | 5/1989 | Seroussi | |
| 4,998,252 A * | 3/1991 | Suzuki | G11B 20/1809 714/756 |
| 5,383,204 A * | 1/1995 | Gibbs | H03M 13/1515 714/756 |
| 5,754,563 A * | 5/1998 | White | H03M 13/151 708/492 |
| 8,347,192 B1 | 1/2013 | Langhammer | |
| 8,707,143 B1 | 4/2014 | Langhammer | |

(Continued)

FOREIGN PATENT DOCUMENTS

EP          1100206 A2    5/2001

*Primary Examiner* — April Y Blair
*Assistant Examiner* — Dipakkumar B Gandhi
(74) *Attorney, Agent, or Firm* — Fletcher Yoder, P.C.

(57) ABSTRACT

The present embodiments relate to Reed-Solomon encoding, and to circuitry for performing such encoding, particularly in an integrated circuit. A Reed-Solomon encoder circuit may receive a message with data symbols and compute a partial syndrome vector by multiplying the data symbols with a first matrix. The Reed-Solomon encoder circuit may further compute parity check symbols by solving a system of linear equations that includes the partial syndrome vector and a second matrix. As an example, the second matrix may be decomposed into a lower triangular matrix and an upper triangular matrix, and the parity check symbols may be computed by performing a forward substitution and a backward substitution using the lower and upper triangular matrices. The Reed-Solomon encoder circuit may generate a Reed-Solomon code word by combining the data symbols and the parity check symbols, and provide the Reed-Solomon code word at an output port.

15 Claims, 8 Drawing Sheets

(56) References Cited

U.S. PATENT DOCUMENTS

| | | |
|---|---|---|
| 8,977,938 B2 | 3/2015 | Langhammer |
| 2005/0188293 A1 | 8/2005 | Ball et al. |
| 2012/0005561 A1 | 1/2012 | Trager et al. |
| 2013/0275839 A1 | 10/2013 | Pilsl |
| 2015/0188604 A1 | 7/2015 | Branlund et al. |

* cited by examiner

METHODS AND APPARATUS FOR PERFORMING REED-SOLOMON ENCODING

BACKGROUND

The present embodiments relate to Reed-Solomon encoding, and to circuitry for performing such encoding, particularly in an integrated circuit.

Many modern applications encode data prior to transmission of the data on a network using error correcting codes such as Reed-Solomon codes. Such codes are capable of providing powerful error correction capability. For example, a Reed-Solomon code of length n and including n–k check symbols may detect any combination of up to 2t=n–k erroneous symbols and correct any combination of up to t symbols.

Most known techniques for Reed-Solomon encoding are based on polynomial division. The direct application of this method allows for calculation of check symbols, which are sometimes also referred to as parity check symbols, based on the input of one data symbol at a time. With k symbols in a message word, k clock cycles are needed to calculate n–k check symbols. By substitution, it may be possible to calculate the check symbols based on the input of a number of data symbols at once, but the feedback nature of such a calculation means that the critical path grows with each additional parallel input symbol, and the encoder operational frequency is decreased quickly.

Moreover, increasing communications, storage, and processing demands require ever more efficient error correction including Reed-Solomon forward error correction (FEC). Consequently, it is desirable to provide improved mechanisms for implementing error correction.

SUMMARY

A Reed-Solomon encoder circuit may receive a message having data symbols and compute a partial syndrome vector by multiplying the data symbols with a first matrix using a multiplier in the Reed-Solomon encoder circuit. The Reed-Solomon encoder circuit may further compute parity check symbols by solving a system of linear equations that includes the partial syndrome vector and a second matrix, and generate a Reed-Solomon code word by combining the data symbols and the parity check symbols. If desired, the Reed-Solomon encoder circuit may provide the Reed-Solomon code word at an output port.

It is appreciated that the embodiments described herein can be implemented in numerous ways, such as a process, an apparatus, a system, a device, or a method executed on a processing machine. Several inventive embodiments of the present invention are described below.

In certain embodiments, the above mentioned second matrix may be decomposed into a lower triangular matrix and an upper triangular matrix. If desired, the Reed-Solomon encoder circuit may compute a forward vector in a finite field by performing a forward substitution based on the partial syndrome vector and multiplying the lower triangular matrix with the forward vector. The Reed-Solomon encoder circuit may compute the parity check symbols in the finite field by performing a backward substitution based on the forward vector and multiplying the upper triangular matrix with the parity check symbols, thereby solving the system of linear equations, and combine the data symbols and the parity check symbols to form the Reed-Solomon code word.

Further features of the invention, its nature and various advantages, will be more apparent from the accompanying drawings and the following detailed description of the preferred embodiments.

DETAILED DESCRIPTION

The present embodiments provided herein relate to Reed-Solomon encoding, and to circuitry for performing such encoding, particularly in an integrated circuit.

Many modern applications encode data prior to transmission of the data on a network. As part of the data encoding, error correcting codes such as Reed-Solomon codes are often included to allow for the detection and/or correction of data signals that were corrupted during the data transmission. Reed-Solomon codes are often used, because they provide powerful error correction capabilities.

However, most known techniques for Reed-Solomon encoding are based on polynomial division, and the feedback nature of such techniques implies that the critical path grows with each additional parallel input. As a result, the encoder operational frequency is decreased quickly. At the same time, increasing communications, storage, and processing demands require ever more efficient error correction.

Consequently, it is desirable to provide improved mechanisms of encoding Reed-Solomon code words. For example, it is desirable to provide a Reed-Solomon encoder that can be easily parallelized and have obvious points of inserting pipelining so that the Reed-Solomon encoder can be used in very fast systems (e.g., 100G Ethernet or 400G Ethernet).

In certain embodiments, Reed-Solomon encoding and/or decoding circuitry may be implemented in an integrated circuit that is coupled to a network, as an example.

It will be recognized by one skilled in the art, that the present exemplary embodiments may be practiced without some or all of these specific details. In other instances, well-known operations have not been described in detail in order not to unnecessarily obscure the present embodiments.

Figure 1:
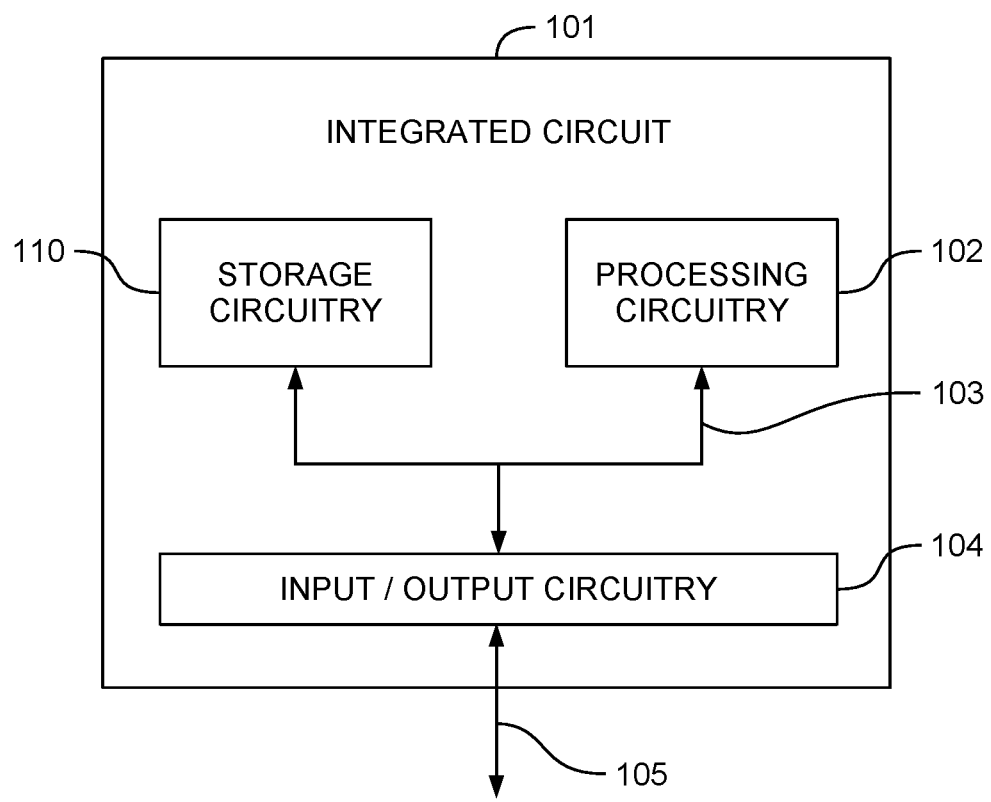
FIG. 1 is a diagram of an illustrative integrated circuit in accordance with an embodiment.

An illustrative embodiment of an integrated circuit 101 is shown in FIG. 1. Integrated circuit 101 may have multiple components. These components may include processing circuitry 102, storage circuitry 110, and input-output circuitry 104. Processing circuitry 102 may include embedded microprocessors, digital signal processors (DSP), microcontrollers, or other processing circuitry.

Storage circuitry 110 may have random-access memory (RAM), read-only memory (ROM), or other addressable memory elements. Storage circuitry 110 may be a single-port memory, a dual-port memory, a quad-port memory, or have any other arbitrary number of ports. If desired, storage circuitry 110 may be implemented as a single-port memory with control circuitry that emulates dual-port, quad-port, or other multi-port behavior. Processing circuitry 102 may access storage circuitry 110 by sending read and/or write requests over interconnection resources 103 to storage circuitry 110. In some embodiments, external components may access storage circuitry 110 via external interconnection resources 105, input-output circuitry 104, and interconnection resources 103. In response to receiving a read request, storage circuitry 110 may retrieve the requested data and send the retrieved data over interconnection resources 103 to the requestor. In case of a write request, storage circuitry 110 may store the received data.

Internal interconnection resources 103 such as conductive lines and busses may be used to send data from one component to another component or to broadcast data from one component to one or more other components. External interconnection resources 105 such as conductive lines and busses, optical interconnect infrastructure, or wired and wireless networks with optional intermediate switches may be used to communicate with other devices.

Input-output circuitry 104 may include parallel input-output circuitry, differential input-output circuitry, serial data transceiver circuitry, or other input-output circuitry suitable to transmit and receive data. If desired, input-output circuitry 104 may include error detection and/or error correction circuitry. For example, input-output circuitry 104 may include Reed-Solomon encoding and/or decoding circuitry that encode data signals by creating Reed-Solomon code words based on the data signals before the data transmission or decode Reed-Solomon code words after the data reception to allow for error correction and reconstitution of the data signals.

Figure 2:
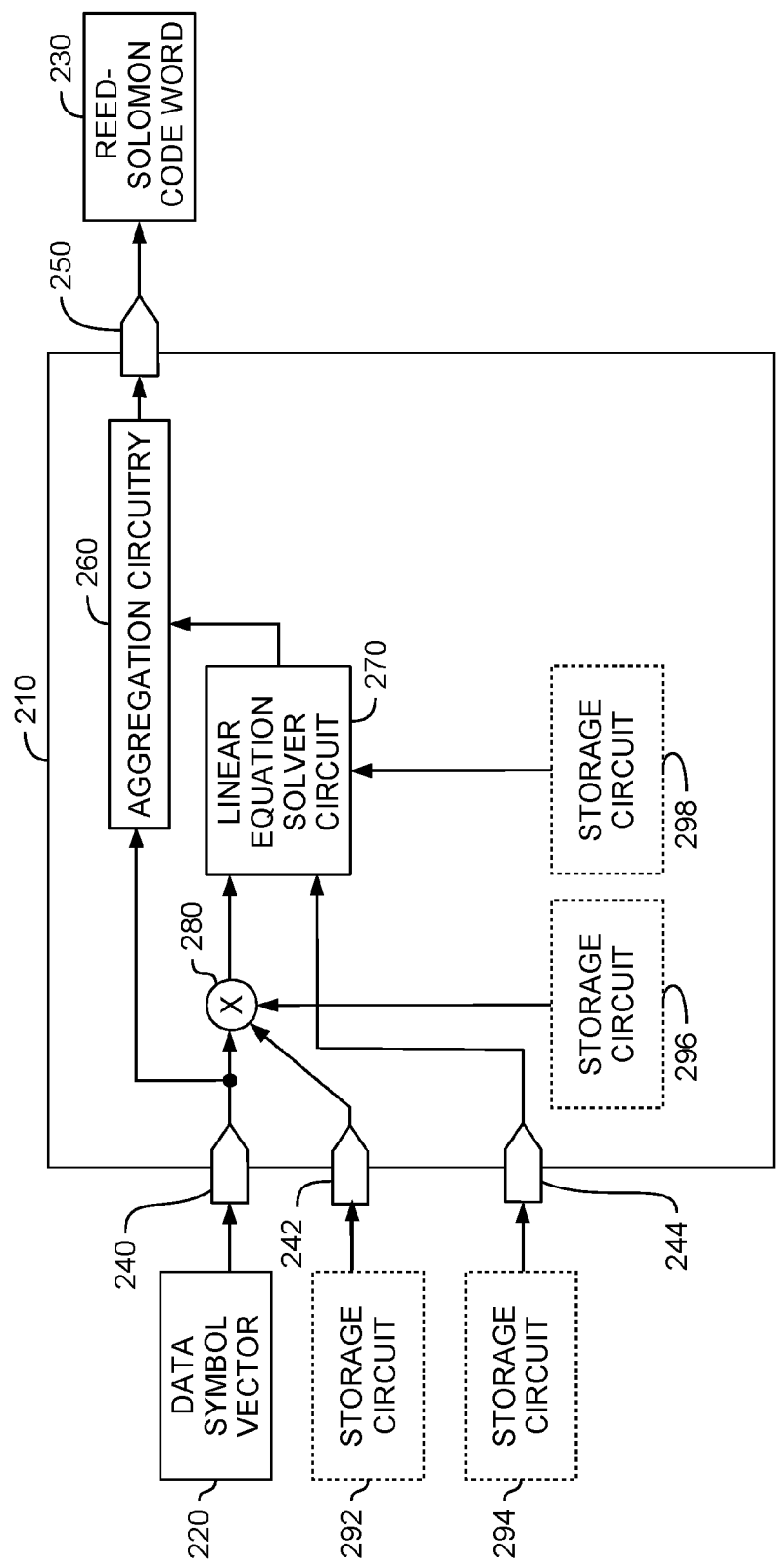
FIG. 2 is a diagram of an illustrative Reed-Solomon encoder circuit in accordance with an embodiment.

FIG. 2 illustrates such a Reed-Solomon encoder circuit. As shown, Reed-Solomon encoder circuit 210 may include input ports 240, 242, and 244, output port 250, multiplier 280, linear equation solver 270, aggregation circuitry 260, and optional storage circuits 296 and 298.

Reed-Solomon encoder circuit 210 may receive a data symbol vector m(X) (220 in FIG. 2), which is sometimes also referred to as a message, at input port 240 and provide a Reed-Solomon code word C(X) (230 in FIG. 2) at output port 250. As an example, data symbol vector m(X) may have k symbols, and Reed-Solomon code word C(X) may have n symbols with n>k. The n-symbol Reed-Solomon code word 230 may include t=n−k parity check symbols p(X) that allow for the detection of up to t erroneous symbols and the correction of up to ⌊t/2⌋ symbols, where ⌊ ⌋ is the floor operator.

Reed-Solomon encoding operates over a finite field, and the n-symbol Reed-Solomon code word 230 may be defined as:

$$C(X)=X^{\wedge}(n-k)m(X)+p(X) \qquad (1)$$

where X^(n−k) shifts data symbol vector m(X) such that the data symbol vector m(X) doesn't overlap with the parity check symbols p(X). Equation 1 may be re-written in the form:

$$C(a^{\wedge}i)=a^{\wedge}((n-k)i)m(a^{\wedge}i)+p(a^{\wedge}i) \qquad (2)$$

The Reed-Solomon code word 230 may be transmitted over a connection and received by a Reed-Solomon decoder circuit as a word R that has n symbols. Word R may include error word E in addition to Reed-Solomon code word C (i.e., R=C+E). The Reed-Solomon decoder circuit may check the word R to detect and correct the error with the goal of restoring the message. For example, the Reed-Solomon decoder circuit may compute a syndrome SYN for the received word using the transpose S^T of a parity check matrix S, which may have n rows and t=(n−k) columns:

$$SYN=R*S^{\wedge}T=C*S^{\wedge}T+E*S^{\wedge}T \qquad (3)$$

Consider the scenario in which the word R is received without an error (i.e., E=0 and R=C). In this scenario, equation (3) is equal to zero (i.e., SYN=C*S^T=0), because S is the parity check matrix of the Reed-Solomon code word C and the Reed-Solomon code word C evaluated at any root is zero.

Thus, if desired, the Reed-Solomon encoder circuit 210 may compute parity check symbols p(X) during Reed-Solomon encoding assuming that a Reed-Solomon code word has been received error free. In this scenario, the Reed-Solomon encoding problem may be stated as a matrix problem in the form:

$$m*Su+p*Sd=0 \qquad (4)$$

where m is the k-symbol message, p the (n−k) parity check symbols, Su includes the first k rows of S, Sd the last (n−k) rows of S. For example, matrices Su and Sd may be defined as:

$$S_u = \begin{bmatrix} \alpha^{(t-1)(n-1)} & \cdots & \alpha^{n-1}, a^0 \\ \vdots & \ddots & \vdots \\ \alpha^{(t-1)(n-k)} & \cdots & \alpha^{n-k}, a^0 \end{bmatrix} \qquad (5)$$

and $$S_d = \begin{bmatrix} \alpha^{(t-1)^2} & \cdots & \alpha^{t-1}, a^0 \\ \vdots & \ddots & \vdots \\ a^0 & \cdots & a^0, a^0 \end{bmatrix} \qquad (6)$$

Matrices Su and Sd may be computed using the generator polynomial of the finite field, which may be sometimes also referred to as the field polynomial. The generator polynomial is usually provided by an industry standard. For example, the 100G Ethernet standard IEEE 802.3bj defines a Reed-Solomon code with n=528, k=514, t=14, and a generator polynomial g(X)=X^10+X^3+1.

Thus, all elements in matrices Su and Sd may be computed once. If desired, matrices Su and Sd may be stored in storage circuits. For example, Reed-Solomon encoder circuit 210 may include storage circuits 296 and 298 to store matrices Su and Sd, respectively. If desired, storage circuits 292 and 294 outside Reed-Solomon encoder circuit 210 may store matrices Su and Sd, respectively, and Reed-Solomon encoder circuit 210 may receive the matrices at input ports 242 and 244, respectively. In some scenarios, one matrix of matrices Su and Sd may be stored inside Reed-Solomon encoder circuit 210 and the other matrix may be stored outside Reed-Solomon encoder circuit 210.

In some embodiments, one or more of storage circuits 292, 294, 296, and 298 may include more than one storage circuit. As an example, matrix Sd may be decomposed into a lower triangular matrix and an upper triangular matrix, and first and second storage circuits in storage circuit 294 (or in storage circuit 298) may store the lower and upper triangular matrices, respectively. As another example, storage circuit 292 (or storage circuit 296) may include k storage circuits that each store one of the k rows of matrix Su. Other arrangements are possible. For example, storage circuit 292 (or storage circuit 296) may include (n−k) storage circuits that each store one of the (n−k) columns of matrix Su, etc.

Reed-Solomon encoder circuit 210 may receive message m as data symbol vector 220 at input port 240. Multiplier 280 may multiply message m with matrix Su to determine a partial syndrome vector SYN (i.e., SYN=m*Su). For example, multiplier 280 may perform a syndrome calculation on the message and continue the syndrome calculation with zeroes inserted where the unknown parity symbols would be. In another example, multiplier 280 may perform a syndrome calculation on the message, stop the syndrome calculation after the last message symbol, and frequency shift the partially computed syndrome in the frequency domain by multiplying the partially computed syndrome with a set of constants.

Thus, the parity check symbols p may be computed by solving is a system of (n−k) equations and (n−k) unknowns:

$$p = SYN/Sd \quad (7)$$

If desired, linear equation solver 270 may receive the partial syndrome vector SYN from multiplier 280 and matrix Sd from storage circuit 294 outside Reed-Solomon encoder circuit or from storage circuit 298 inside Reed-Solomon encoder circuit and determine p by solving the system of (n−k) equations of equation (7).

Aggregation circuit 260 of FIG. 2 may combine the data symbol vector and the parity check symbols, thereby generating Reed-Solomon code word 230, and provide Reed-Solomon code word 230 at output port 250 of Reed-Solomon encoder circuit 210.

Figure 3:
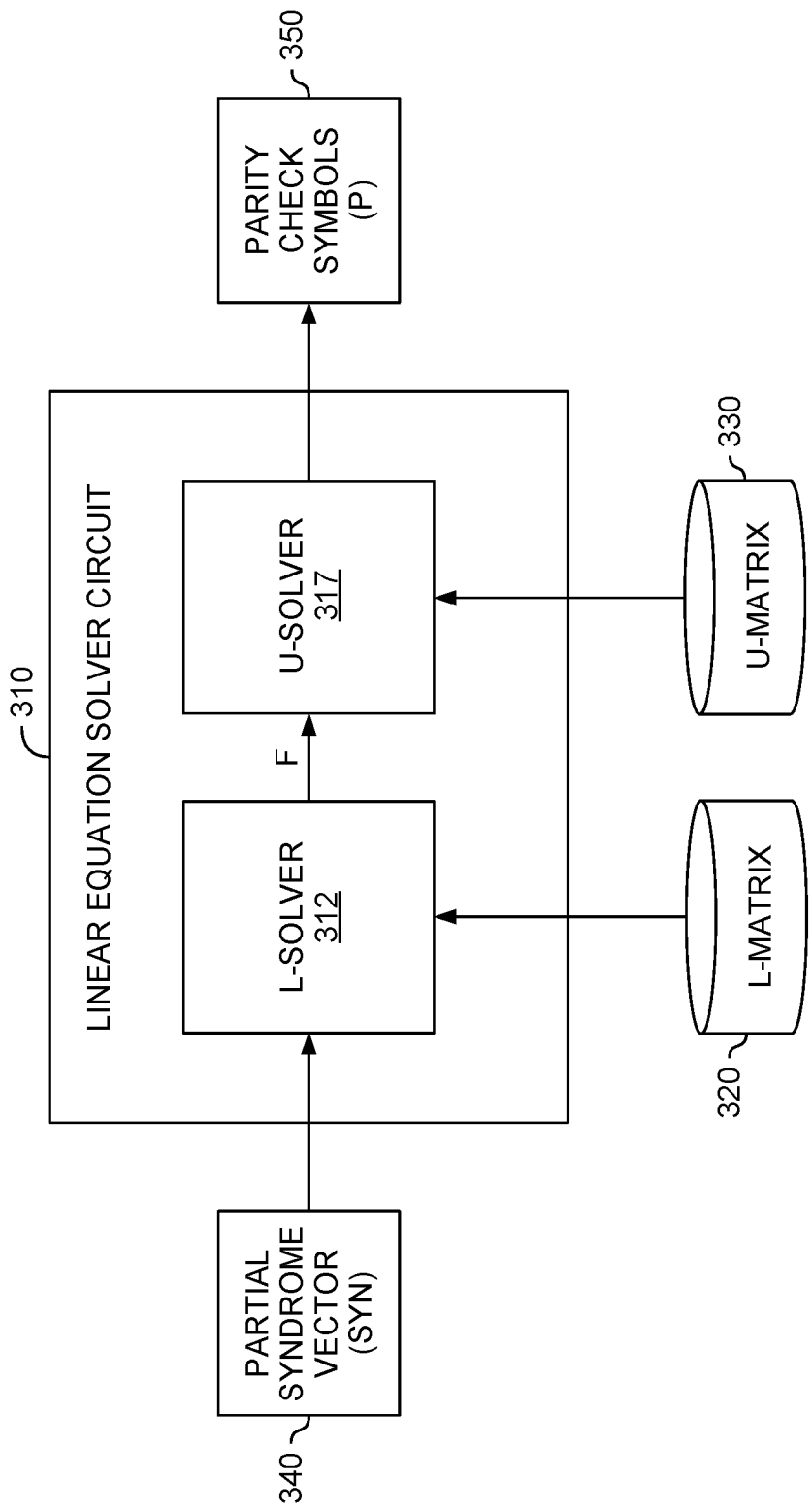
FIG. 3 is a diagram of an illustrative linear equation solver circuit that computes parity check symbols for a Reed-Solomon code word in accordance with an embodiment.

FIG. 3 is a diagram of an illustrative linear equation solver circuit that computes parity check symbols for a Reed-Solomon code word in accordance with an embodiment. As shown, linear equation solver circuit 310 may receive partial syndrome vector SYN (340 in FIG. 3) and generate parity check symbols p (350 in FIG. 3).

As an example, consider the scenario in which an LU decomposition (e.g., the Crout matrix decomposition) has decomposed a matrix (e.g., matrix Sd of equation (7)) into the product of a lower triangular matrix L-matrix (320 in FIG. 3) and an upper triangular matrix U-matrix (330 in FIG. 3):

$$Sd = L\text{-matrix} * U\text{-matrix} \quad (8)$$

In this scenario, linear equation solver circuit 310 may solve a system of equations such as the system of (n−k) equations shown in equation (7) in two steps. In a first step, linear equation solver circuit 310 may perform a forward substitution using L-solver 312 to compute forward vector F based on the partial syndrome vector SYN and L-matrix 320:

$$F = SYN/L\text{-matrix} \quad (9)$$

In a second step, linear equation solver circuit 310 may perform a backward substitution using U-solver 317 to compute parity check symbols p based on the forward vector F and U-matrix 330:

$$P = F/U\text{-matrix} \quad (10)$$

If desired, the parity check symbols p may be computed using the transpose of matrix Sd (i.e., matrix Sd')

$$S'_d = \begin{bmatrix} a^0 & \cdots & a^0, a^0 \\ \vdots & \ddots & \vdots \\ a^{(t-1)^2} & \cdots & a^{t-1}, a^0 \end{bmatrix} \quad (11)$$

and the partial syndrome vector SYN in reverse order.

As an example, consider the scenario in which a syndrome computation circuit has computed the partial syndrome vector SYN based on message m and matrix Su:

$$SYN = (SYN\_1, SYN\_2, \ldots, SYN\_(n-k)) \quad (12)$$

For example, the syndrome computation circuit may perform a syndrome calculation on the message and continue the syndrome calculation with zeroes inserted where the unknown parity symbols would be. In another example, the syndrome computation circuit may perform a syndrome calculation on the message, stop the syndrome calculation after the last message symbol, and frequency shift the partially computed syndrome using a set of constants.

Consider further that the Crout matrix decomposition has decomposed matrix Sd' into an L-matrix and a U-matrix and that a^0=1:

$$L\text{-matrix} = \begin{bmatrix} L_{11}, 0 & \cdots & 0 \\ \vdots & \ddots & \vdots \\ L_{(n-k)1}, L_{(n-k)2} & \cdots & L_{(n-k)(n-k)} \end{bmatrix} \quad (13)$$

$$U\text{-matrix} = \begin{bmatrix} U_{11} & \cdots & U_{1(n-k-1)}, U_{1(n-k)} \\ \vdots & \ddots & \vdots \\ 0 & \cdots & 0, U_{(n-k)(n-k)} \end{bmatrix} \quad (14)$$

As a result, the lower triangular matrix L-matrix may have a one at position L_11 and zeroes above the main diagonal, and the U-matrix may be a unit upper triangular matrix with ones on the main diagonal (i.e., from U_11 to U_(n−k)(n−k)) and in the first row (i.e., from U_11 to U_1(n−k)) and zeroes below the main diagonal.

Figure 4:
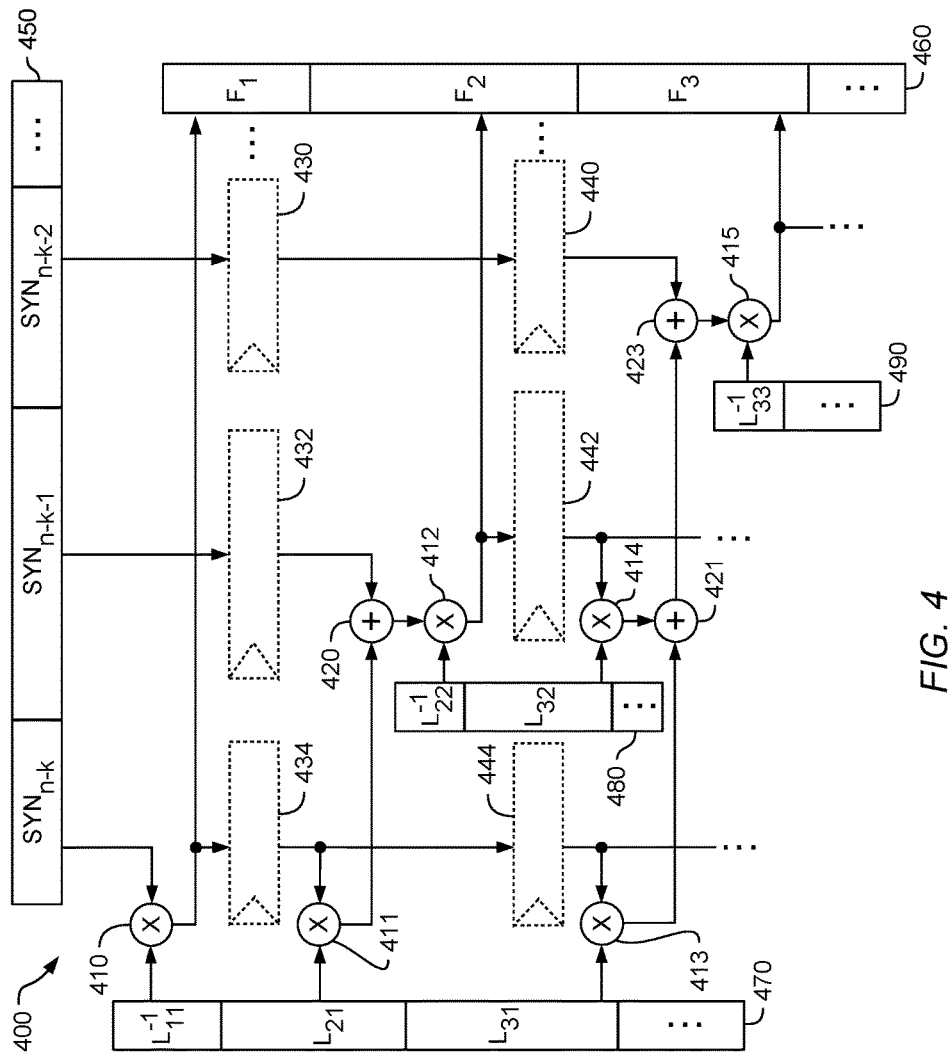
FIG. 4 is a diagram of an illustrative L-solver circuit that performs a forward substitution in accordance with an embodiment.
Figure 5:
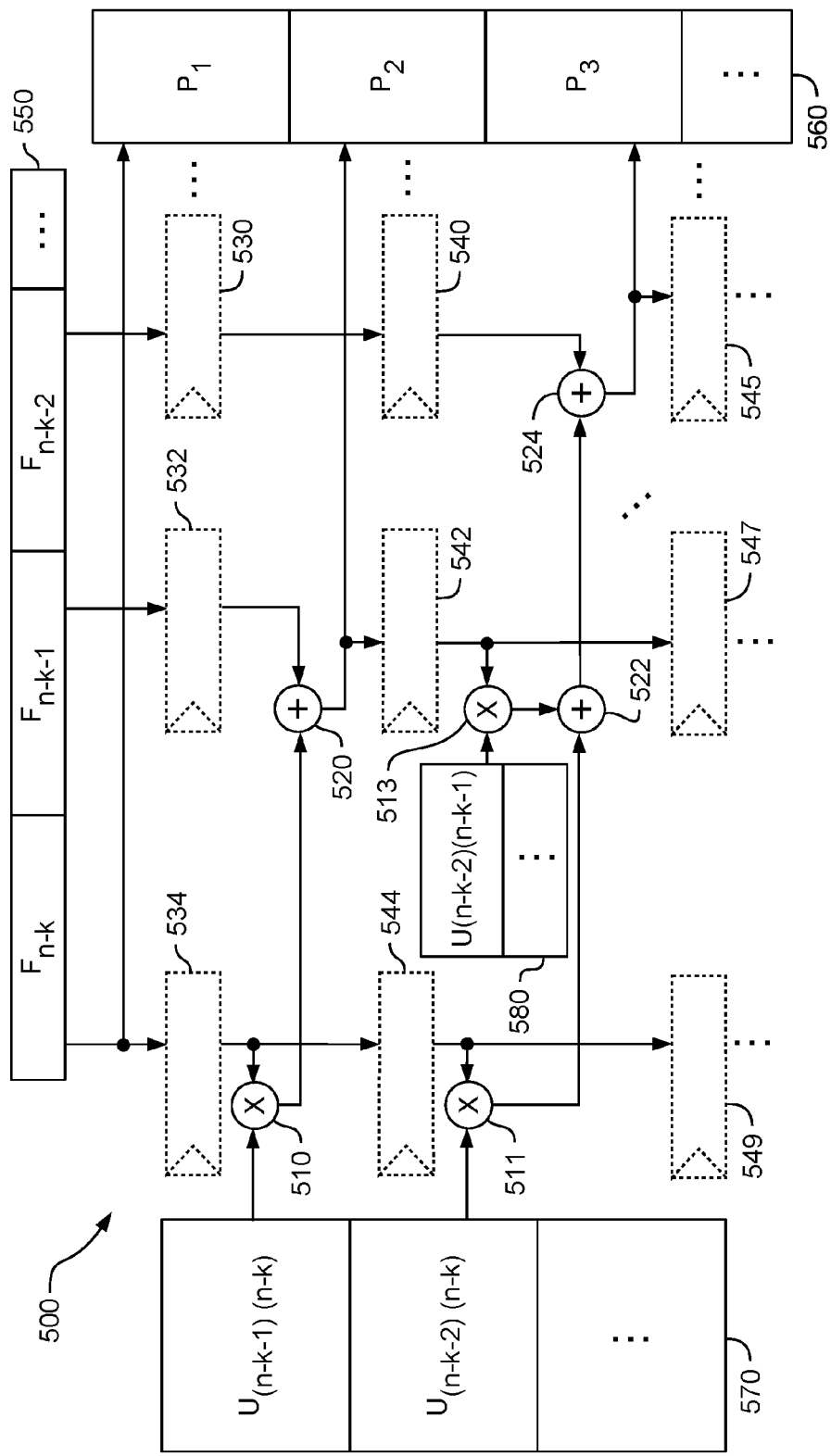
FIG. 5 is a diagram of an illustrative U-solver circuit that performs a backward substitution in accordance with an embodiment.

In this scenario, L-solver circuit 400 of FIG. 4 may perform a forward substitution to compute forward vector F (460 in FIG. 4) based on partial syndrome vector SYN (450 in FIG. 4) and the L-matrix of equation (13). The order of the partial syndromes may be reversed as a result of the Crout matrix decomposition of the transpose matrix Sd' into L-matrix and U-matrix:

$$L\text{-matrix} * (F\_1, F\_2, \ldots, F\_(n-k)) = (SYN\_(n-k), \ldots, SYN\_1) \quad (15)$$

and U-solver circuit 500 of FIG. 5 may perform a backward substitution to compute the parity check symbols p (560 in FIG. 5) based on forward vector F (550 in FIG. 5) and the U-matrix of equation 14:

$$U\text{-matrix} * (F\_1, F\_2, \ldots, F\_(n-k)) = (p\_1, p\_2, \ldots, p\_(n-k)) \quad (16)$$

One or more storage circuits may store the L-matrix of equation (13) and the U-matrix of equation (14). In some embodiments, the one or more storage circuits may omit storing the zeroes above the main diagonal of the L-matrix and below the main diagonal of the U-matrix and/or the ones on the main diagonal of the U-matrix. In other words, the one or more storage circuits may store the elements on and below the main diagonal of the L-matrix of equation (13) and the elements above the main diagonal of the U-matrix of equation (14).

The computation of forward vector 460 may involve the division by the element on the main diagonal of the L-matrix. For example, the first element of forward vector 460 (i.e., F_1) may be computed as F_1=SYN_(n−k)/L_11, the second element of forward vector 460 (i.e., F_2) may be computed over the finite field as F_2=(L_21*F_1+SYN_(n−k−1))/L_22, the third element of forward vector 460 (i.e., F_3) may be computed over the finite field as F_3= (L_31*F_1+L_32*F_2+SYN_(n−k−2))/L_33, etc.

Thus, the computation of a current element of forward vector 460 may include computing the sum of the previously computed elements of forward vector 460 multiplied with the elements of the current row of the L-matrix and the current element of partial syndrome vector 450, and dividing the sum by the last non zero value in the current row of the L-matrix (i.e., by the element on the main diagonal of the current row).

If desired, multiplication with the inverse value of the element on the main diagonal of the current row may replace the division. For example, the one or more storage circuits mentioned above may store inverse values of the elements on the main diagonal of the L-matrix.

As shown in FIG. 4, multiplier 410 may compute the first element of forward vector 460 (i.e., F_1) by multiplying the inverse of element L_11 with element SYN_(n−k) of partial syndrome vector 450. If desired, multiplier 410 may be omitted since L_11 has the value one. Thus, storing element L_11 or the inverse of element L_11 may be omitted as well.

Multiplier 411 may compute the product of F_1 and L_21, adder 420 may compute the sum of the product and SYN_(n−k−1), and multiplier 412 may multiply the sum with the inverse of L_22 to produce F_2. Multiplier 413 may compute the product of F_1 and L_31, multiplier 414 the product of F_2 and L_32, adder 421 a first sum of the two products, adder 423 a second sum of the first sum and SYN_(n−k−2), and multiplier 415 may multiply the second sum with the inverse of L_33 to produce F_3. The remaining elements of forward vector 460 may be computed in a similar way.

If desired, L-solver circuit 400 may include optional pipeline stages. For example, a first pipeline stage may include pipeline registers 434, 432, 430, etc. Pipeline registers 434, 432, 430, etc. may store F_1, SYN_(n−k−1), SYN_(n−k−2), etc., respectively, before the computation of F_2. Similarly, a second pipeline stage that includes pipeline registers 444, 442, 440, etc. may store F_1, F_2, SYN_(n−k−2), etc., respectively before the computation of F_3.

If desired, L-solver circuit 400 may include additional pipeline stages. For example, the pipeline registers 434, 432, 430, etc. of the first pipeline register stage may each include more than one register arranged in series. In some embodiments, L-solver circuit 400 may include pipeline stages between the storage circuit that stores the elements of the L-matrix (e.g., 470, 480, and 490) and the respective multiplier, at the output of the respective multipliers (e.g., 410, 411, 413, etc.), just to name a few.

As mentioned above, U-solver circuit 500 of FIG. 5 may perform a backward substitution to compute the parity check symbols p (560 in FIG. 5) based on forward vector F (550 in FIG. 5) and the U-matrix of equation (14). Since the U-matrix of equation (14) includes ones on the main diagonal, the division or multiplication with the inverse of the element on the main diagonal of the U-matrix may be omitted during the computation of the parity check symbols p.

Thus, U-solver circuit 500 may perform the computation of a current element of parity check symbols by computing the sum of the previously computed elements of parity check symbols 560 multiplied with the elements of the current row of the U-matrix and the current element of forward vector 550.

As shown in FIG. 5, the first element of parity check symbols 560 may be equal to F_(n−k) (i.e., p_1=F_(n−k)). Multiplier 510 may compute the second element of parity check symbols 560 (i.e., p_2) by multiplying element U_(n−k−1) (n−k) of the U-matrix with element F_(n−k) of forward vector 550, and adding the result to F_(n−k−1). Multiplier 511 may compute the product of F_(n−k) and U_(n−k−2) (n−k), multiplier 513 the product of p_2 and U_(n−k−2) (n−k−1), adder 522 a first sum of the two products, and adder 524 a second sum of the first sum and F_(n−k−2). The remaining elements of parity check symbols 560 may be computed in a similar way.

If desired, U-solver circuit 500 may include optional pipeline stages. For example, a first pipeline stage may include pipeline registers 534, 532, 530, etc. Pipeline registers 534, 532, 530, etc. may store F_(n−k), F_(n−k−1), F_(n−k−2), etc., respectively, before the computation of p_2. A second pipeline stage that includes pipeline registers 544, 542, 540, etc. may store F_(n−k), p_2, F_(n−k−2), etc., respectively, before the computation of p_3. A third pipeline stage that includes pipeline registers 549, 547, 545, etc. may store F_(n−k), p_2, p_3, etc., respectively, before the computation of p_4.

If desired, U-solver circuit 500 may include additional pipeline stages. For example, the pipeline registers 534, 532, 530, etc. of the first pipeline register stage may each include more than one register arranged in series. In some embodiments, U-solver circuit 500 may include pipeline stages between the storage circuit that stores the elements of the U-matrix (e.g., 570, 580, and 590) and the respective multiplier, at the output of the respective multipliers (e.g., 510, 511, etc.), just to name a few.

As the forward substitution performed by L-solver circuit 400 and the backward substitution performed by U-solver circuit 500 are similar, a single circuits may perform both operations, if desired.

Figure 6:
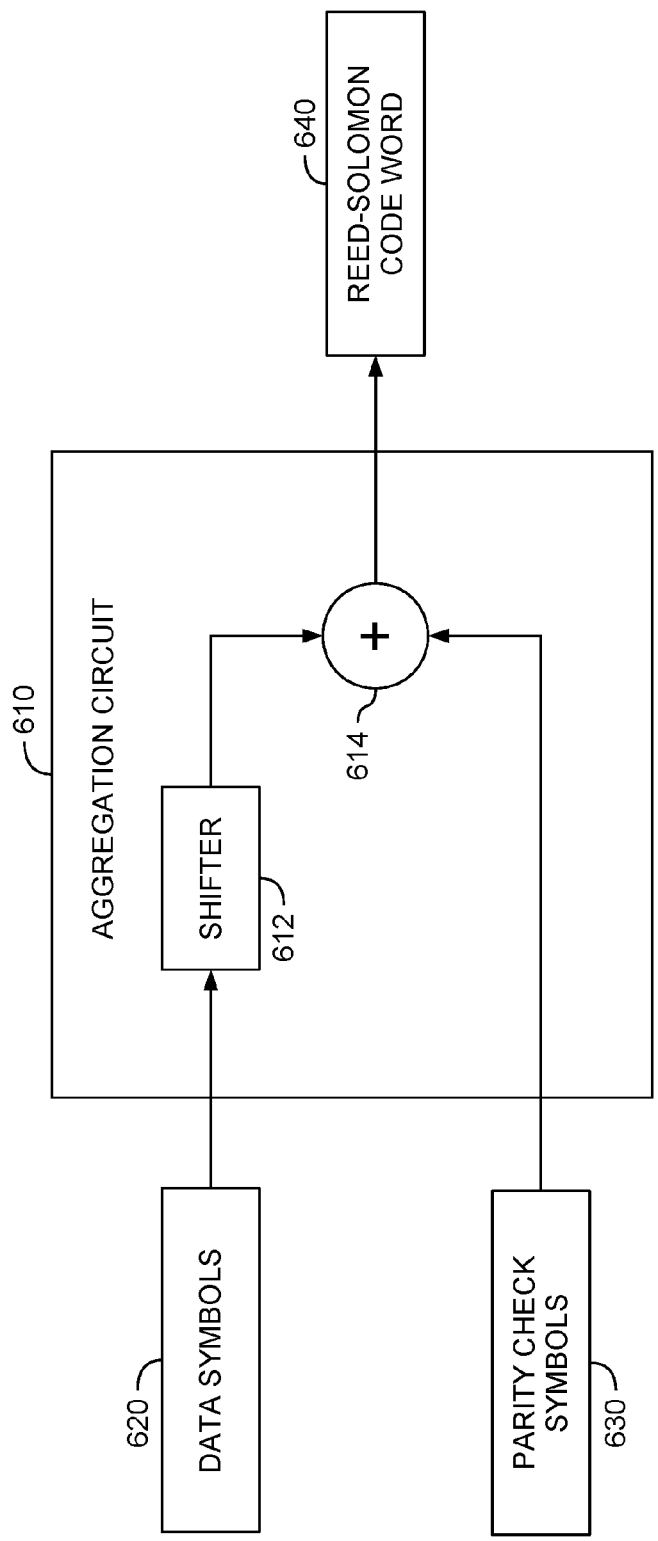
FIG. 6 is a diagram of an illustrative aggregation circuit that combines data symbols with parity check symbols to form a Reed-Solomon code word in accordance with an embodiment.

The generation of a Reed-Solomon code word may include the combination of the parity check symbols with the data symbols. FIG. 6 is a diagram of an illustrative aggregation circuit 610 that combines data symbols 620 with parity check symbols 630 to form Reed-Solomon code word 640 in accordance with an embodiment.

As shown in FIG. 6, aggregation circuit 610 may include shifter 612 and adder 614. Consider the scenario in which aggregation circuit 610 receives k data symbols and n−k parity check symbols. In this scenario, shifter 612 may shift the data symbols in the time domain n−k positions to the left and insert n−k zeroes at the least significant symbol positions. Adder 614 may compute the sum of the shifted data symbols and the parity check symbols 630 to generate Reed-Solomon code word 640.

If desired, data symbols and parity check symbols may be combined without performing shift and/or add operations. For example, aggregation circuit 610 may generate Reed-Solomon code word 640 by providing (n−k) parity check symbols 630 and k data symbols 620 on n parallel connections, whereby each of the n parallel connections conveys either one symbol of parity check symbols 630 or one symbol of data symbols 620. A router circuit may arrange the combined data symbols 620 and parity check symbols 630 in a desired order.

Figure 7:
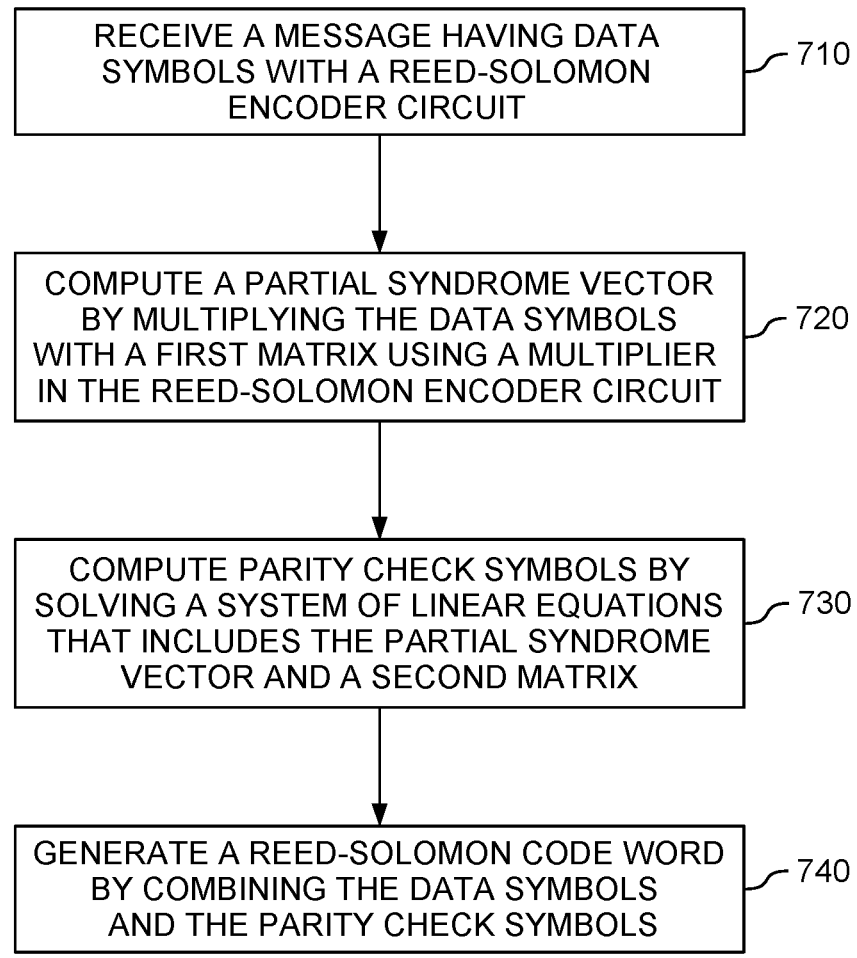
FIG. 7 is a diagram of a flow chart showing illustrative steps for operating a Reed-Solomon encoder circuit in accordance with an embodiment.

FIG. 7 is a diagram of a flow chart showing illustrative steps for operating a Reed-Solomon encoder circuit (e.g., Reed-Solomon encoder circuit 210 of FIG. 2) in accordance with an embodiment. During step 710, the Reed-Solomon encoder circuit may receive a message having data symbols. For example, Reed-Solomon encoder circuit 210 of FIG. 2 may receive data symbol vector 220 at input port 240.

During step 720, the Reed-Solomon encoder circuit may compute a partial syndrome vector by multiplying the data symbols with a first matrix using a multiplier. For example, multiplier 280 in Reed-Solomon encoder circuit 210 of FIG. 2 may receive the data symbol vector from input port 240 and a matrix from storage circuit 296 or via input port 242 from storage circuit 292 and multiply the data symbol vector with the matrix to produce a partial syndrome vector.

During step 730, the Reed-Solomon encoder circuit may compute parity check symbols by solving a system of linear equations that includes the partial syndrome vector and a second matrix. For example, linear equation solver circuit 270 in Reed-Solomon encoder circuit 210 of FIG. 2 may receive the partial syndrome vector from multiplier 280 and another matrix from storage circuit 298 or via input port 244 from storage circuit 295 and compute parity check symbols by solving a system of linear equations that includes multiplying the other matrix with the parity check symbols to yield the partial syndrome vector.

During step 740, the Reed-Solomon encoder circuit may generate a Reed-Solomon code word by combining the data symbols and the parity check symbols. For example, aggregation circuit 260 in Reed-Solomon encoder circuit 210 of FIG. 2 may receive the data symbol vector from input port 240 and the parity check symbols from linear equation solver circuit 270 and combine the data symbol vector with the parity check symbols to generate Reed-Solomon code word 230.

Figure 8:
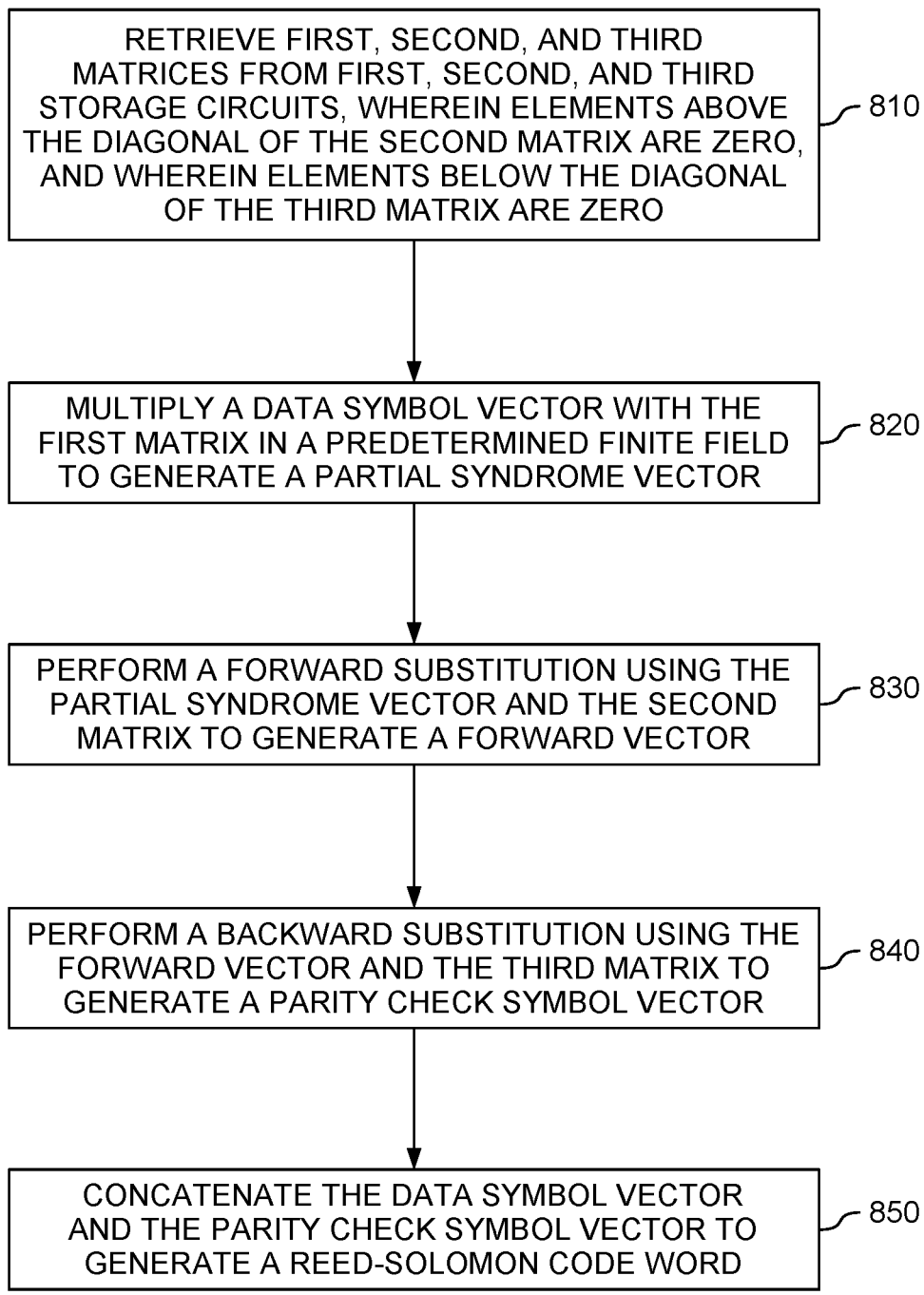
FIG. 8 is a diagram of a flow chart showing illustrative steps for generating a Reed-Solomon code word in accordance with an embodiment.

FIG. 8 is a diagram of a flow chart showing illustrative steps for generating a Reed-Solomon code word in accordance with an embodiment. During step 810, a Reed-Solomon encoder circuit may retrieve first, second, and third matrices from first, second, and third storage circuits, wherein elements above the diagonal of the second matrix are zero, and wherein elements below the diagonal of the third matrix are zero. For example, the Crout matrix decomposition may decompose matrix Sd into the product of L-matrix and U-matrix as shown in equation (8), and matrix Su of equation (5) together with the L-matrix and the U-matrix from the decomposition may be stored in respective storage circuits.

During step 820, the Reed-Solomon encoder circuit may multiply a data symbol vector with the first matrix in a predetermined finite field to generate a partial syndrome vector. For example, multiplier 280 of FIG. 2 may multiply data symbol vector 220 with matrix Su that may be stored in storage circuit 292 to generate a partial syndrome vector.

During step 830, the Reed-Solomon encoder circuit may perform a forward substitution using the partial syndrome vector and the second matrix to generate a forward vector. For example, linear equation solver circuit 310 of FIG. 3 may implement linear equation solver circuit 270 of FIG. 2. L-solver circuit 312 may retrieve L-matrix 320 from a first storage circuit of storage circuit 294 and perform a forward substitution using partial syndrome vector 340 and L-matrix 320 to generate forward vector F.

During step 840, the Reed-Solomon encoder circuit may perform a backward substitution using the forward vector and the third matrix to generate a parity check symbol vector. For example, U-solver circuit 317 of FIG. 3 may retrieve U-matrix 330 from a second storage circuit of storage circuit 294 and perform a backward substitution using the forward vector F and U-matrix 330 to generate parity check symbols 350.

During step 850, the Reed-Solomon encoder circuit may concatenate the data symbol vector and the parity check symbol vector to generate a Reed-Solomon code word. For example, aggregation circuit 260 in Reed-Solomon encoder circuit 210 of FIG. 2 may concatenate data symbol vector 220 with the parity check symbols from linear equation solver circuit 270 to generate Reed-Solomon code word 230.

The method and apparatus described herein may be incorporated into any suitable electronic device or system of electronic devices. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), coarse-grained reconfigurable architectures (CGRAs), digital signal processing (DSP) circuits, application specific standard products (ASSPs), application specific integrated circuits (ASICs), just to name a few.

The integrated circuit described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using Reed-Solomon encoding is desirable.

The integrated circuit may be configured to perform a variety of different logic functions. For example, the integrated circuit may be configured as a processor or controller that works in cooperation with a system processor. The integrated circuit may also be used as an arbiter for arbitrating access to a shared resource in the data processing system. In yet another example, the integrated circuit may be configured as an interface between a processor and one of the other components in the system. In one embodiment, the integrated circuit may be one of the families of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for operating a Reed-Solomon encoder circuit that is coupled to a network, comprising: receiving a message having data symbols with the Reed-Solomon encoder circuit; computing a partial syndrome vector by multiplying the data symbols with a first matrix using a multiplier in the Reed-Solomon encoder circuit; with a linear equation solver circuit in the Reed-Solomon encoder circuit, computing parity check symbols by solving a system of linear equations that includes the partial syndrome vector and a second matrix; with aggregation circuitry in the Reed-Solomon encoder circuit, generating a Reed-Solomon code word by combining the data symbols and the parity check symbols; and transmitting the Reed-Solomon code word from an output port of the Reed-Solomon encoder circuit over the network.

2. The method of claim 1, wherein the second matrix is decomposed into a lower triangular matrix and an upper triangular matrix.

3. The method of claim 2, further comprising:
storing elements of the lower and upper triangular matrices that are non-zero in at least one storage circuit.

4. The method of claim 2, wherein solving the system of linear equations further comprises:
computing a forward vector in a finite field by performing a forward substitution based on the partial syndrome vector and multiplying the lower triangular matrix with the forward vector.

5. The method of claim 4, further comprising:
computing the parity check symbols in the finite field by performing a backward substitution based on the forward vector and multiplying the upper triangular matrix with the parity check symbols.

6. The method of claim 1, wherein computing the partial syndrome vector further comprises:
using constant multipliers to shift the partial syndrome vector by multiplying the partial syndrome vector with constant numbers.

7. The method of claim 1, wherein combing the data symbols and the parity check symbols further comprises:
concatenating the data symbols and the parity check symbols to form the Reed-Solomon code word.

8. A Reed-Solomon encoder circuit that is coupled to a network, comprising: an input port that receives a data symbol vector; a multiplication circuit that receives the data symbol vector from the input port and a first matrix from a first storage circuit and that computes a partial syndrome vector by multiplying the first matrix with the data symbol vector; a linear equation solver circuit that receives the partial syndrome vector from the multiplication circuit and a second matrix from a second storage circuit and that computes parity check symbols based on the partial syndrome vector and the second matrix; and aggregation circuitry that receives the data symbol vector from the input port and the parity check symbols from the linear equation solver circuit and that generates a Reed-Solomon code word for transmission over the network by combining the data symbol vector and the parity check symbols.

9. The Reed-Solomon encoder circuit of claim 8, wherein the second storage circuit stores a decomposition of the second matrix into a lower triangular matrix and an upper triangular matrix, and wherein the linear equation solver circuit further comprises:
a first solver circuit with first and second processing stages, wherein the first solver circuit receives the partial syndrome vector from the multiplication circuit and the lower triangular matrix from the second storage circuit and computes a forward vector by solving a first linear equation system that includes the lower triangular matrix and the partial syndrome vector; and
a second solver circuit with third and fourth processing stages, wherein the second solver circuit receives the forward vector from the first solver circuit and the upper triangular matrix from the second storage circuit and computes the parity check symbols by solving a second linear equation system that includes the upper triangular matrix and the forward vector.

10. The Reed-Solomon encoder circuit of claim 9, wherein the first processing stage of the first solver circuit computes a first element of the forward vector, and wherein the second processing state of the first solver circuit further comprises:
a finite field multiplier that receives the first element of the forward vector from the first processing stage and a first entry of the lower triangular matrix from the second storage circuit and that computes a product of the first element of the forward vector and the first entry of the lower triangular matrix by performing a finite field multiplication in a predefined Galois field.

11. The Reed-Solomon encoder circuit of claim 10, further comprising:
a finite field adder that receives the product from the finite field multiplier and an element of the partial syndrome vector from the multiplication circuit and that computes a sum of the product and the element of the partial syndrome vector by performing a finite field addition in the predefined Galois field.

12. The Reed-Solomon encoder circuit of claim 11, further comprising:
an additional finite field multiplier that receives the sum from the finite field adder and a second entry of the lower triangular matrix from the second storage circuit and that performs an additional finite field multiplication in the predefined Galois field of the sum from the finite field adder and the second entry of the lower triangular matrix to compute a second element of the forward vector.

13. The Reed-Solomon encoder circuit of claim 9, wherein the first solver circuit further comprises:
a pipeline register stage between the first and second processing stages that is synchronized by a clock signal having a clock period, wherein the pipeline register stage receives signals from the first processing stage and stores the signals for at least one clock period.

14. The Reed-Solomon encoder circuit of claim 9, wherein the third processing stage of the second solver circuit computes a first element of the parity check symbols, and wherein the fourth processing stage of the second solver circuit further comprises:
a finite field multiplier that receives the first element of the parity check symbols from the third processing stage and a first entry of the upper triangular matrix from the second storage circuit and that computes a product of the first element of the parity check symbols and the first entry of the upper triangular matrix by performing finite field multiplication in a predefined Galois field; and
a finite field adder that receives the product from the finite field multiplier and an element of the forward vector from the first solver circuit and that performs a finite field addition in the predefined Galois field of the product from the finite field multiplier and the element of the forward vector to compute a second element of the parity check symbols.

15. The Reed-Solomon encoder circuit of claim 8, wherein the aggregation circuitry further comprises:
a left shifter that shifts the data symbol vector by the number of parity check symbols to the left to generate a shifted data symbol vector.

* * * * *